(12) United States Patent
Choi et al.

(10) Patent No.: US 9,390,812 B2
(45) Date of Patent: Jul. 12, 2016

(54) E-FUSE TEST DEVICE AND SEMICONDUCTOR DEVICE INCLUDING THE SAME

(71) Applicant: Samsung Electronics Co., Ltd., Suwon-si (KR)

(72) Inventors: Hyun-Min Choi, Uiwang-si (KR); In-Gyu Park, Seoul (KR); Jung-Hak Song, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/713,458

(22) Filed: May 15, 2015

(65) Prior Publication Data
US 2016/0005494 A1   Jan. 7, 2016

(30) Foreign Application Priority Data
Jul. 1, 2014   (KR) ........................ 10-2014-0081862

(51) Int. Cl.
| | | |
|---|---|---|
| *G11C 17/00* | (2006.01) | |
| *G11C 17/18* | (2006.01) | |
| *G11C 17/16* | (2006.01) | |
| *G11C 29/02* | (2006.01) | |
| *G11C 29/50* | (2006.01) | |
| *G11C 29/12* | (2006.01) | |

(52) U.S. Cl.
CPC ............... *G11C 17/18* (2013.01); *G11C 17/16* (2013.01); *G11C 29/027* (2013.01); *G11C 2029/1206* (2013.01); *G11C 2029/5006* (2013.01)

(58) Field of Classification Search
CPC ........................................................ G11C 17/16
USPC ............................................................ 365/96
See application file for complete search history.

(56) References Cited

U.S. PATENT DOCUMENTS

| | | | | |
|---|---|---|---|---|
| 4,638,243 | A * | 1/1987 | Chan .................... | G01R 31/025 324/509 |
| 4,969,124 | A * | 11/1990 | Luich ..................... | G11C 29/50 365/201 |
| 6,205,063 | B1 | 3/2001 | Aipperspach et al. | |
| 7,224,633 | B1 | 5/2007 | Hovis et al. | |
| 7,254,080 | B2 | 8/2007 | Kimura | |
| 7,688,613 | B2 | 3/2010 | Chung et al. | |
| 7,911,820 | B2 | 3/2011 | Anand et al. | |
| 8,077,531 | B2 | 12/2011 | Song et al. | |
| 8,581,657 | B2 | 11/2013 | Itoh | |

(Continued)

FOREIGN PATENT DOCUMENTS

| | | |
|---|---|---|
| JP | 05-013686 | 1/1993 |
| JP | 05-067683 | 3/1993 |

(Continued)

*Primary Examiner* — Son Mai
(74) *Attorney, Agent, or Firm* — Muir Patent Law, PLLC

(57) ABSTRACT

An e-fuse test device is provided. The e-fuse test device may include a first transistor, and a fuse array connected to a source/drain terminal of the first transistor. The fuse array may include n fuse groups, each of the fuse groups may include one end, the other end, and m first fuse elements connected in series to each other between the one end and the other end, the one end of each of the fuse groups may be connected to each other, and the other end of each of the fuse groups may be connected to the source/drain terminal of the first transistor, and the n and m are natural numbers that are equal to or larger than two.

18 Claims, 7 Drawing Sheets

(56) References Cited

U.S. PATENT DOCUMENTS 8,861,297 B2 * 10/2014 Sforzin ................ G11C 17/16
 365/189.07
2008/0246098 A1 * 10/2008 Kurjanowicz ......... G11C 17/16
 257/408

FOREIGN PATENT DOCUMENTS

| JP | 05-250979 | 9/1993 |
| KR | 10-2008-0009099 A | 1/2008 |
| KR | 10-2014-0001482 A | 1/2014 |
| WO | WO 2011-052176 A1 | 5/2011 |

* cited by examiner

TEST REGION I

TEST REGION II

E-FUSE TEST DEVICE AND SEMICONDUCTOR DEVICE INCLUDING THE SAME

CROSS-REFERENCE TO RELATED APPLICATIONS

This application claims priority under 35 U.S.C. §119 to Korean Patent Application No. 10-2014-0081862, filed on Jul. 1, 2014 in the Korean Intellectual Property Office, the disclosure of which is incorporated herein in its entirety by reference.

BACKGROUND

1. Technical Field

The present disclosure relates to semiconductor devices, and more particularly, to semiconductor devices including an e-fuse test device.

2. Description of the Prior Art

In the semiconductor field, fuses are used to implement various purposes. For example, in the case of a memory device, in order to improve chip yield, fuses are used in a repair process in which defective memory cells are replaced by redundancy memory cells. In addition to such a repair process, fuses may be used for chip identification that records information on fabrication histories of chips or for chip customization that optimizes the characteristics of the chips after a fabrication-out process.

Such fuses may be briefly classified into laser fuses and e-fuses according to their program method. The laser fuses are configured to be selectively programmed (i.e., open-circuited) using laser, and the e-fuses are configured to be selectively programmed using current.

SUMMARY

Some example embodiments provide an e-fuse test device, which can measure programming current of an e-fuse.

Some example embodiments provide a semiconductor device including the e-fuse test device.

Some example embodiments provide a method for determining e-fuse programming current using the e-fuse test device.

Some advantages, subjects, and features of the invention will be set forth in part in the description which follows and in part will become apparent to those having ordinary skill in the art upon examination of the following or may be learned from practice of the invention.

According to an aspect of the present disclosure, there is provided an e-fuse test device comprising a first transistor, and a fuse array. The first transistor may include a first gate terminal configured to receive a first gate voltage, a first source/drain terminal, and a second source/drain terminal, wherein the e-fuse test device may be configured to detect a current passing through the first transistor. The fuse array may include n sets of fuses, each set arranged between a first end line and a second end line, wherein each respective set of fuses of the n sets of fuses may include a first end, a second end, and m first fuse elements connected in series to each other between the first end and the second end, wherein the first ends of each of the respective sets of fuses of the n sets of fuses may be connected to the first end line, and the second ends of the respective sets of fuses of the n sets of fuses are connected to the second end line and the first source/drain terminal of the first transistor, wherein the first end line may be configured to receive a first source voltage, and wherein the n and m are natural numbers that are equal to or larger than 2.

Each respective set of fuses of the n sets of fuses may comprise (m−1) connection terminals that connect the adjacent first fuse elements to each other, wherein the (m−1) connection terminals of each respective set of fuses of the n sets of fuses includes an l-th connection terminal and the l-th connection terminals of the respective sets of fuses of the n sets of fuses are connected to each other, and wherein l is a natural number that is equal to or larger than 1 and equal to or smaller than (m−1).

Each respective set of fuses of the n sets of fuses may comprise (m−1) connection terminals each connecting the adjacent first fuse elements to each other, and wherein each connection terminal of the (m−1) connection terminals may be connected to corresponding connection terminals of the respective sets of fuses of the n sets of fuses. The n and m may be the same number.

The e-fuse test device may further comprise a second transistor and a second fuse element. The second transistor may include a gate terminal configured to receive a second gate voltage, a first source/drain terminal, and a second source/drain terminal, wherein the e-fuse test device may be configured to detect a current passing through the second transistor. The second fuse element may include a first end connected to the first source/drain terminal of the second transistor and a second end configured to receive a second source voltage.

The fuse array may have a first resistance value, and the second fuse element has a second resistance value between the first end line and the second end line, and the first resistance value and the second resistance value are substantially equal.

The n and m may be the same number, and a resistance value of each of the m first fuse elements and a resistance value of the second fuse element are equal to each other.

Each voltage level of the first and second source voltages may be substantially equal. Each voltage level of the first and second gate voltages may be substantially equal.

According to another aspect of the present disclosure, there is provided an e-fuse test device comprising a first transistor, and a first fuse array. The first transistor may include a first gate terminal configured to receive a first gate voltage, a first source/drain terminal, and a second source/drain terminal, wherein the e-fuse test device may be configured to detect a current passing through the first transistor. The first fuse array may include n sets of fuses, n being a natural number equal to or greater than 2. Each respective set of fuses of the n sets of fuses may include a first end, a second end, and n first fuse elements connected in series to each other between the first end and the second end. The respective sets of fuses of the n sets of fuses may be connected in parallel to each other. The respective first ends of the respective sets of fuses may be connected to each other and are configured to receive a first source voltage. The respective second ends of the respective sets of fuses may be connected to the first source/drain terminal of the first transistor.

An l-th first fuse element of the n first fuse elements may be located in the l-th position in each respective set of fuses of the n sets of fuses, wherein l may be equal to or greater than 1 and equal to or less than n and the l is equal to or larger than 1 and equal to or smaller than n. The l-th first fuse element may include a first end and a second end. The respective first ends of the l-th first fuse elements of the respective sets of fuses of the n sets of fuses may be connected to each other or respective second ends of the l-th first fuse elements of the respective sets of fuses of the n sets of fuses may be connected to each other.

The e-fuse test device may further comprise a second transistor and a second fuse element. The second transistor may include a gate terminal configured to receive a second gate voltage, a first source/drain terminal, and a second source/drain terminal, wherein the e-fuse test device may be configured to detect a current passing through the second transistor. The second fuse element may include a first end connected to the first source/drain terminal of the second transistor and a second end configured to receive a second source voltage.

A resistance value of each of the n first fuse elements may be equal to a resistance value of the second fuse element.

The e-fuse test device may further comprise a third transistor and a second fuse array. The third transistor may include a gate terminal configured to receive a third gate voltage, a first source/drain terminal, and a second source/drain terminal, wherein the e-fuse test device may be configured to detect a current passing through the third transistor. The second fuse array may include m sets of fuses, m being a natural number equal to or greater than 2 and different from n. Each respective set of fuses of m sets of fuses may include a third end, a fourth end, and m third fuse elements connected in series to each other between the third end and the fourth end. The respective sets of fuses of m sets of fuses may be connected in parallel to each other. The respective third ends of the respective sets of fuses of the m sets of fuses may be connected to each other and are configured to receive a third source voltage. The respective fourth ends of the respective sets of fuses of the m sets of fuses may be connected to the first source/drain terminal of the third transistor.

A resistance value of each of the m third fuse elements is equal to a resistance value of the fourth fuse element.

Each voltage level of the third and fourth source voltages is substantially equal. Each voltage level of the third and fourth gate voltages is substantially equal.

According to still another aspect of the present disclosure, there is provided a semiconductor device comprising a first circuit and a second circuit. The first circuit may include a first transistor having a gate electrode configured to receive a first gate voltage, a first source/drain electrode and a second source/drain electrode, and a fuse array, the first circuit configured to detect a current passing through the first transistor, wherein the fuse array may include a first end line, a second end line, and first through nth sets of fuses arranged in a row direction between the first and second end lines, wherein each set of the first through nth sets of fuses may include m first fuse elements connected in series to each other and arranged in a column direction between the first and second end lines, wherein the first end line of the fuse array may be configured to receive a first source voltage and the second end line of the fuse array may be connected to the second source/drain electrode of the first transistor, and wherein m and n may be natural numbers equal to or greater than 2. The second circuit may include a second transistor having a gate electrode configured to receive a second gate voltage, a first source/drain electrode and a second source/drain electrode, and a second fuse element, the second circuit configured to detect a current passing through the second transistor, wherein a first end of the second fuse element may be connected to the first source/drain electrode of the second transistor and a second end of the second fuse element may be configured to receive a second source voltage.

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION OF THE EMBODIMENTS

Figure 1A:
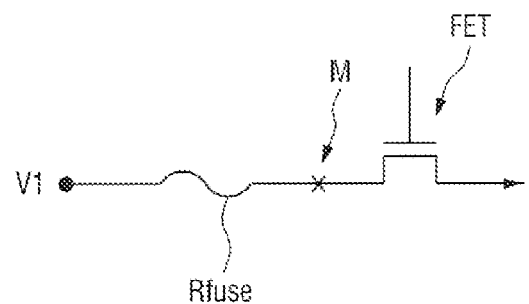
FIGS. 1A and 1B are example diagrams explaining a theoretical method for determining e-fuse programming current.

The present disclosure will now be described more fully hereinafter with reference to the accompanying drawings, in which some example embodiments are shown. This disclosure may, however, be embodied in different forms and should not be construed as limited to the embodiments set forth herein. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," "comprises," "includes," and/or "containing" are to be construed as open-ended terms (i.e., meaning "including, but not limited to,") unless otherwise noted, and when used herein, specify the presence of stated features, integers, steps, operations, elements, and/or components, but do not preclude the presence or addition of one or more other features, integers, steps, operations, elements, components, and/or groups thereof.

Unless the context indicates otherwise, terms such as "same," "planar," "equal," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to typical manufacturing processes. The term "substantially" may be used herein to reflect this meaning.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Figure 1B:
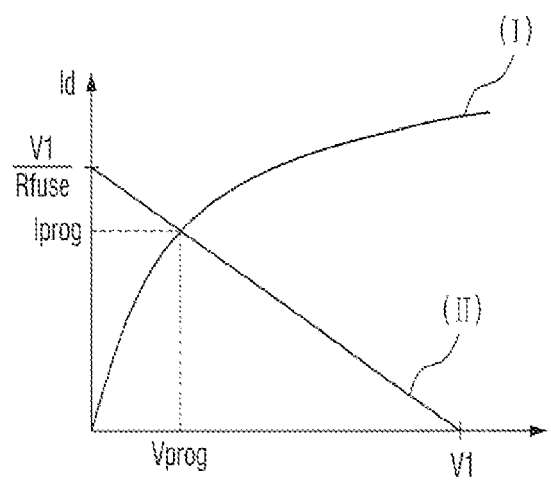

FIGS. 1A and 1B are example diagrams explaining a theoretical method for determining e-fuse programming current. For reference, FIG. 1A is an equivalent circuit diagram explaining a method for determining e-fuse programming current, and FIG. 1B is a graph explaining a method for determining e-fuse programming current. Further, in FIG. 1B, graph (I) is a curve that indicates drain current with respect to a theoretical drain-to-source voltage of a transistor FET illustrated in FIG. 1A, and graph (II) is a load line of an e-fuse $R_{fuse}$ illustrated in FIG. 1A.

Referring to FIGS. 1A and 1B, one end of the e-fuse $R_{fuse}$ is connected to a source/drain terminal of the transistor FET, and the other end thereof is connected to a voltage source V1. The e-fuse $R_{fuse}$ is connected in series to the transistor FET. A gate terminal of the transistor FET may be configured to receive a gate voltage.

If a form factor of the transistor FET is determined, a theoretical shape of the graph (I) illustrated in FIG. 1B is determined.

Further, if a voltage of the voltage source V1 that is applied to the e-fuse $R_{fuse}$ is determined, the load line of the e-fuse $R_{fuse}$ itself is also determined. That is, X-intercept of the graph (II) illustrated in FIG. 1B represents a voltage that is applied from the voltage source V1, and Y-intercept of the graph (II) illustrated in FIG. 1B represents a value that is obtained by dividing the voltage applied from the voltage source V1 by a resistance value of the e-fuse $R_{fuse}$.

As illustrated in FIG. 1B, if the graph regarding the transistor FET and the graph regarding the e-fuse $R_{fuse}$ are illustrated as one graph, the graph (I) and the graph (II) meet each other. At a point where the graph (I) and the graph (II) meet each other, the voltage becomes a programming voltage $V_{prog}$, and the current becomes programming current $I_{prog}$.

That is, the voltage and current at the point where the graph (I) and the graph (II) meet each other become the voltage and current for programming the e-fuse $R_{fuse}$.

Further, the programming voltage $V_{prog}$ and the programming current $I_{prog}$ become the voltage and current at a point M where the transistor FET and the e-fuse $R_{fuse}$ meet each other in FIG. 1A.

As described above, the voltage and current for programming the e-fuse $R_{fuse}$ can be theoretically calculated. However, the theoretical voltage and current are calculated under the assumption that the e-fuse $R_{fuse}$ and the transistor FET are in an ideal state. Accordingly, there may exist a difference between the actual voltage and current for programming the e-fuse $R_{fuse}$ and the theoretical voltage and current for programming the e-fuse $R_{fuse}$.

Figure 2:
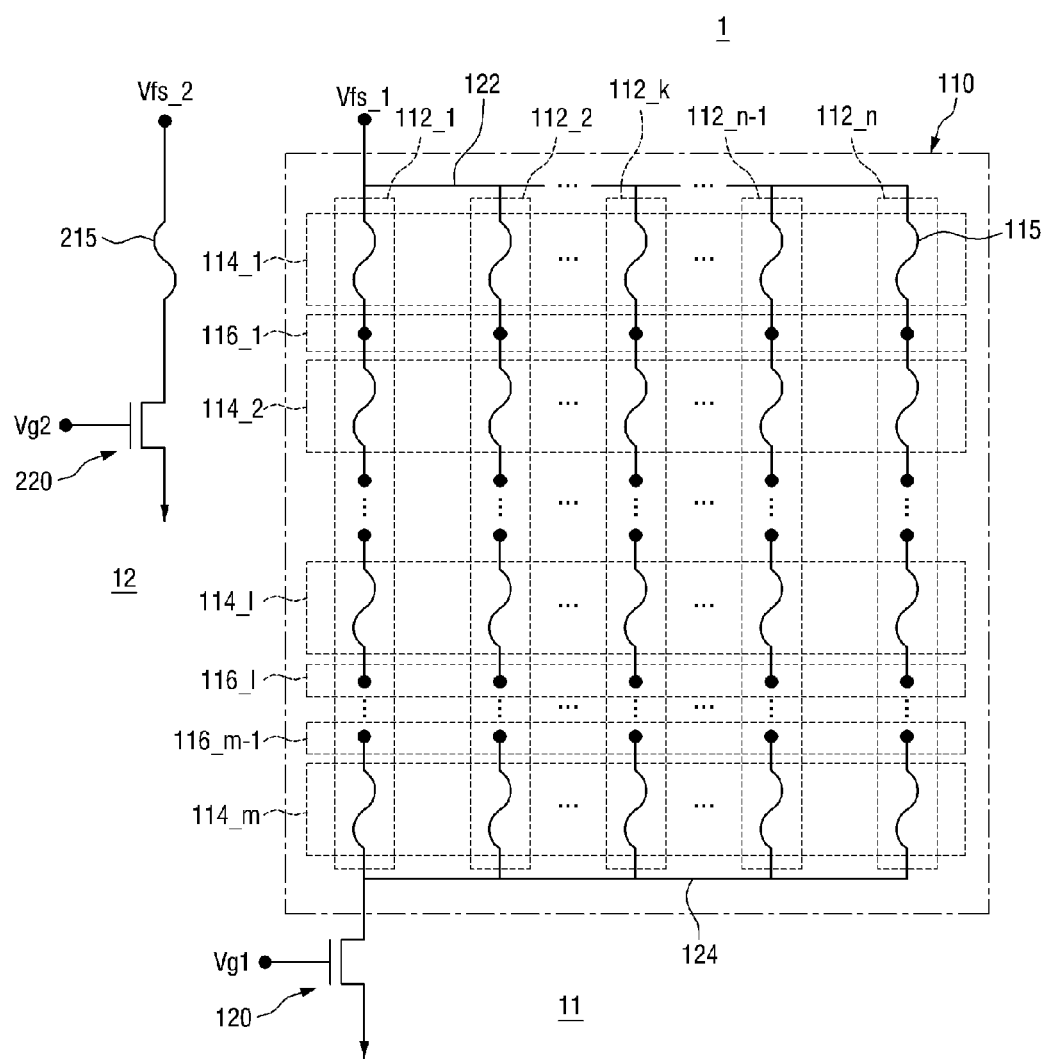
FIG. 2 is a circuit diagram explaining an exemplary e-fuse test structure according to a first embodiment of the present disclosure.

FIG. 2 is a circuit diagram explaining an exemplary e-fuse test structure according to a first embodiment of the present disclosure.

Referring to FIG. 2, an e-fuse test device 1 according to the first embodiment of the present disclosure may include a first circuit 11 and a second circuit 12. The first circuit 11 includes a first transistor 120 and a first fuse array 110, and the second circuit 12 includes a second transistor 220 and a second fuse element 215. In one embodiment, the e-fuse test device 1 may be included in a semiconductor device. As used herein, a semiconductor device may refer to various items such as a memory device, one or more logic devices or memory cells formed in or on a semiconductor substrate, a semiconductor chip, a memory chip, a logic chip, a package, or combinations thereof. A semiconductor device such as a semiconductor chip, a memory chip, or a logic chip may be formed from a semiconductor wafer. A semiconductor device may comprise a package which may include one or more chips, such as chips stacked on a package substrate, or a package-on-package device including a plurality of packages. In another embodiment, the e-fuse test device 1 may be included in some portions of a semiconductor wafer during a manufacturing processing of a semiconductor device. Both the first circuit 11 and second circuit 12 may be in the semiconductor wafer, but separated later when the wafer is singulated (e.g., cut) to create semiconductor chips (e.g., one including one or more second circuits). Alternatively, both the first circuit 11 and second circuit 12 may be separated from the wafer and be part of the same semiconductor chip. The semiconductor wafer may divide a device region and a test region (e.g., some portions or a scribe region).

A first gate voltage $V_{g1}$ may be applied to a gate terminal of the first transistor 120. Further, a first source/drain terminal of the first transistor 120 may be connected to a detector (e.g., a current detector) that detects current passing through a channel region of the first transistor 120. A second source/drain terminal of the first transistor 120 is connected to the first fuse array 110.

The first fuse array 110 is arranged between a first end line 122 and a second end line 124. The first end line 122 of the first fuse array 110 may be connected to a first fuse source $V_{fs\_1}$ (e.g., a first voltage source) and the second end line 124 of the first fuse array 110 is connected to the second source/drain terminal of the first transistor 120. The first fuse array 110 is connected in series to the second source/drain terminal of the first transistor 120. Further, the first fuse array 110 is not connected to the gate terminal of the first transistor 120. The current detector may be connected between the first fuse source $V_{fs\_1}$ and the first end line 122 of the first fuse array 110.

The first fuse array 110 may include n first column fuse groups (e.g., n sets of fuses) 112_1 to 112_n. Here, n is a natural number that is equal to or larger than "2".

Each of the first column fuse groups 112_1 to 112_n may include m first fuse elements 115. That is, m first fuse elements 115 that are included in each of the first column fuse groups 112_1 to 112_n are connected in series to each other. Here, m is a natural number that is equal to or larger than "2".

Further, each of the first column fuse groups 112_1 to 112_n includes (m−1) connection nodes located between the adjacent first fuse elements 115. That is, since each of the first column fuse groups 112_1 to 112_n includes m first fuse elements 115, each of the first column fuse groups 112_1 to 112_n includes (m−1) connection nodes.

Each of the first column fuse groups 112_1 to 112_n includes one end (e.g., a first end) and the other end (e.g., a second end). Between one end of each of the first column fuse groups 112_1 to 112_n and the other end of each of the first column fuse groups 112_1 to 112_n, m first fuse elements 115 are connected in series to each other.

One end of each of the first column fuse groups 112_1 to 112_n is connected to each other. One end of each of the first column fuse groups 112_1 to 112_n is electrically connected to the first fuse source $V_{fs\_1}$. Further, the other end of each of the first column fuse groups 112_1 to 112_n is connected to each other. The other end of each of the first column fuse groups 112_1 to 112_n is connected to the second source/drain terminal of the first transistor 120.

The first fuse array 110 may include m first row fuse groups 114_1 to 114_m. Each of the first row fuse groups 114_1 to 114_m may include n first fuse elements 115.

Further, the first fuse array 110 includes (m−1) first connection terminal groups 116_1 to 116_m−1. Each of the first connection terminal groups 116_1 to 116_m−1 includes connection terminals that are positioned in the same order from one end of each of the first column fuse groups 112_1 to 112_n. Each of the first connection terminal groups 116_1 to 116_m−1 includes n connection terminals.

For example, each of the first connection terminal groups 116_1 to 116_m−1 includes connection terminals that correspond to connection terminals of each of the first column fuse groups 112_1 to 112_n. Specifically, if the order of the connection terminals is defined on the basis of one end of each of the first column fuse groups 112_1 to 112_n, the (m−1)-th first connection terminal group 116_m−1 includes the (m−1)-th connection terminals of each of the first column fuse groups 112_1 to 112_n.

In the first fuse array 110, the first row fuse groups 114_1 to 114_m and the first connection terminal groups 116_1 to 116_m−1 may be alternately arranged. That is, in the first fuse array 110, the first connection terminal groups 116_1 to 116_m−1 may be arranged one by one between the adjacent first row fuse groups 114_1 to 114_m.

The first fuse array 110 may be an e-fuse structure that includes m×n first fuse elements 115.

In the e-fuse test device according to the first embodiment of the present disclosure, n connection terminals that are included in each of the first connection terminal groups 116_1 to 116_m−1 may not be electrically connected to each other. That is, in the first fuse array 110, m first fuse elements 115 that are included in each of the first column fuse groups 112_1 to 112_n are connected in series to each other. However, n first fuse elements 115 that are included in each of the first row fuse groups 114_1 to 114_m may not be connected to each other.

A second gate voltage $V_{g2}$ may be applied to a gate terminal of the second transistor 220. Further, a first source/drain terminal of the second transistor 220 may be connected to a detector that detects current passing through a channel region of the second transistor 220. A second source/drain terminal of the second transistor 220 may be connected to the second fuse element 215.

However, if the second fuse element 215 is programmed to be disconnected, current may not flow to the channel region of the second transistor 220.

The second fuse element 215 is arranged between a second fuse source $V_{fs\_2}$ (e.g., a second voltage source) and the second source/drain terminal of the second transistor 220. The second fuse element 215 is connected in series to the second source/drain terminal of the second transistor 220. Further, the second fuse element 215 is not connected to the gate terminal of the second transistor 220.

It is sufficient if the first fuse element 115 and the second fuse element 215 are e-fuses, but the shapes of the first fuse element 115 and the second fuse element 215 are not limited.

The resistance value of the first fuse array 110 between the first end line 122 and the second end line 124 is a first resistance value, and the resistance value of the second fuse element 215 is a second resistance value. The first resistance value of the first fuse array 110 may be an equivalent resistance value of the m×n first fuse elements 115 that are included in the first fuse array 110.

In the e-fuse test device 1 according to embodiments of the present disclosure, the first resistance value of the first fuse array 110 may be substantially equal to the second resistance value of the second fuse element 215.

As an example, if m and n are the same natural number, the resistance value of the first fuse element 115 may be equal to the resistance value of the second fuse element 215. For example, if it is assumed that the resistance value of each of the first fuse element 115 and the second fuse element 215 is R, each of the first column fuse groups 112_1 to 112_n has the resistance value of m×R. However, since n first column fuse groups 112_1 to 112_n are connected in parallel to each other, the equivalent resistance value of the first fuse array 110 becomes (m×R)/n. In this case, since m and n are the same natural number, the equivalent resistance value of the first fuse array 110 becomes R. Accordingly, the resistance value of each of the first fuse array 110 and the second fuse element 215 becomes equal to each other, that is, R. Here, the term "equal resistance value" means not only "completely equal resistance value" but also "resistance value including a minute difference in resistance value that may occur due to a margin in the manufacturing process".

As another example, if m and n are not the same natural number, the resistance value of the first fuse element 115 may be different from the resistance value of the second fuse element 215. For example, if it is assumed that the resistance values of the first fuse element 115 and the second fuse element 215 are R1 and R2, respectively, each of the first column fuse groups 112_1 to 112_n has the resistance value of m×R1. However, since n first column fuse groups 112_1 to 112_n are connected in parallel to each other, the equivalent resistance value of the first fuse array 110 becomes (m×R1)/n. In this case, if the resistance value R1 of the first fuse element 115 is (n×R2)/m, the equivalent resistance value of the first fuse array 110 and the resistance value of the second fuse element 215 become equal to each other.

In the following description, for convenience in explanation, it is assumed that m and n are the same natural number.

In the e-fuse test device 1 according to embodiments of the present disclosure, the first gate voltage $V_{g1}$ that is applied to the gate terminal of the first transistor 120 is equal to the second gate voltage $V_{g2}$ that is applied to the gate terminal of the second transistor 220.

Further, in the e-fuse test device according to embodiments of the present disclosure, the voltage that is applied from the first fuse source $V_{fs\_1}$ to the first fuse array 110 may be equal to the voltage that is applied from the second fuse source $V_{fs\_2}$ to the second fuse element 215. In one embodiment, a voltage level of the first fuse source $V_{fs\_1}$ may be equal to a voltage level of the second fuse source $V_{fs\_2}$.

In one embodiment, except for the structural difference between the first fuse array 110 and the second fuse element 215, the gate voltages that are applied to the first transistor 120 and the second transistor 220 may be equal. For example, a voltage level of the first gate voltage $V_{g1}$ may be equal to a voltage level of the second gate voltage $V_{g2}$. Through this, when the second fuse element 215 is programmed to be disconnected, the current that flows to the second fuse element 215 may be indirectly measured from the first fuse array 110.

More specifically, if the second fuse element 215 and the first fuse array 110 have the same resistance value and the same voltages of the fuse sources $V_{fs\_1}$ and $V_{fs\_2}$ and the same gate terminal voltages $V_{g1}$ and $V_{g2}$ are applied to the first circuit 11 and the second circuit 12, respectively, the same current may flow to the first fuse array 110 and the second fuse element 215. Accordingly, when the second fuse element 215 is programmed to be disconnected, the current that flows to the second fuse element 215 may become equal to the current that passes through the channel region of the first transistor 120.

In one embodiment, when the e-fuse test device 1 includes a first external pad connected to the first end line 122 and a second external pad connected to the first source/drain terminal of the first transistor 120, a current passing through the first transistor of the first circuit 11 may be measured at a package including the e-fuse test device 1. Similarly, when the e-fuse test device 1 includes a third external pad connected to a first end of the second fuse 215 and a fourth external pad connected to the first source/drain terminal of the second transistor 220, a current passing through the second transistor of the second circuit 12 may be measured at a package including the e-fuse test device 1.

Figure 3:
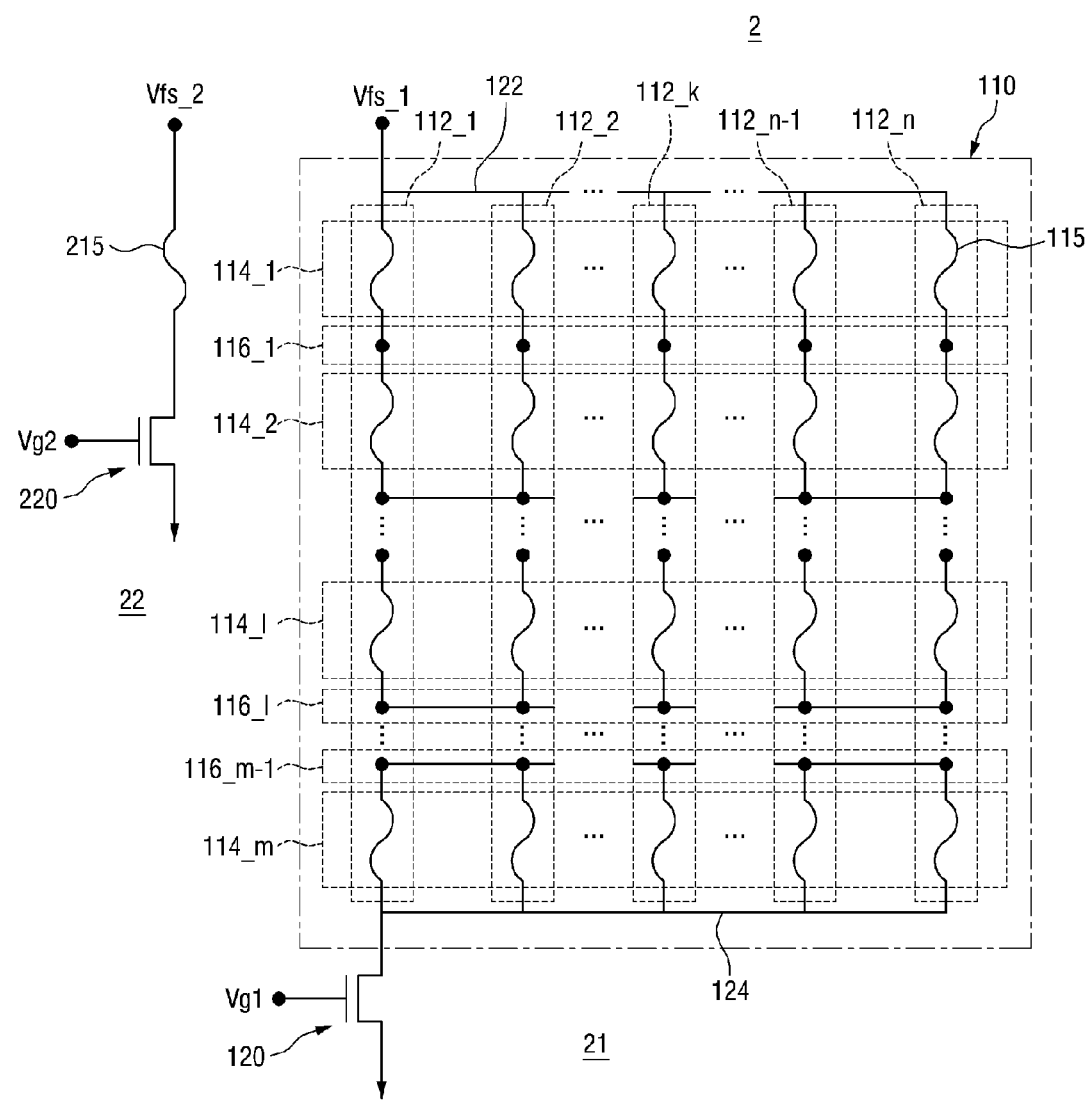
FIG. 3 is a circuit diagram explaining an exemplary e-fuse test device according to a second embodiment of the present disclosure.

FIG. 3 is a circuit diagram explaining an exemplary e-fuse test device according to a second embodiment of the present disclosure. For convenience in explanation, explanation will be made around different points from those as described above using FIG. 2.

Referring to FIG. 3, in an e-fuse test device 2 according to the second embodiment of the present disclosure may include a first circuit 21 and a second circuit 22. The first circuit 21 includes a first transistor 120 and a first fuse array 110, and the second circuit 22 includes a second transistor 220 and a second fuse element 215. In one embodiment, at least one of the first connection terminal groups 116_1 to 116_$m$−1 may have all of its connection terminals directly connected to each other. For example, in FIG. 3, the connection terminals of the first connection terminal group 116_$m$−1 are all connected to each other. In an alternative embodiment, only some of the connection terminals of one or more connection terminal groups 116_1 to 116_$m$−1 may be connected to each other in one or more groups of connected connection terminals.

For example, direct connection of the l-th first connection terminal group 116_1 will be described. Here, l is equal to or larger than "1", and equal to or smaller than $m$−1.

The l-th first connection terminal group 116_1 is a gathering of connection terminals that are in the l-th position from one end of each of the first column fuse groups 112_1 to 112_$n$. For example, the l-th first connection terminal group 116_1 includes n connection terminals.

Unlike the explanation with reference to FIG. 2, in the e-fuse test device 2 according to the second embodiment of the present disclosure, n connection terminals that are included in the l-th first connection terminal group 116_1 are directly connected to each other. Since n connection terminals that are included in the l-th first connection terminal group 116_1 are connected to each other, the l-th first connection terminal group 116_1 of the first fuse array 110 is positioned on an equipotential line.

As illustrated in FIG. 3, even if some of the ($m$−1) first connection terminal groups 116_1 to 116_$m$−1 are connected to each other, the equivalent resistance value of the first fuse array 110 becomes equal to the resistance value of the second fuse element 215.

Figure 4:
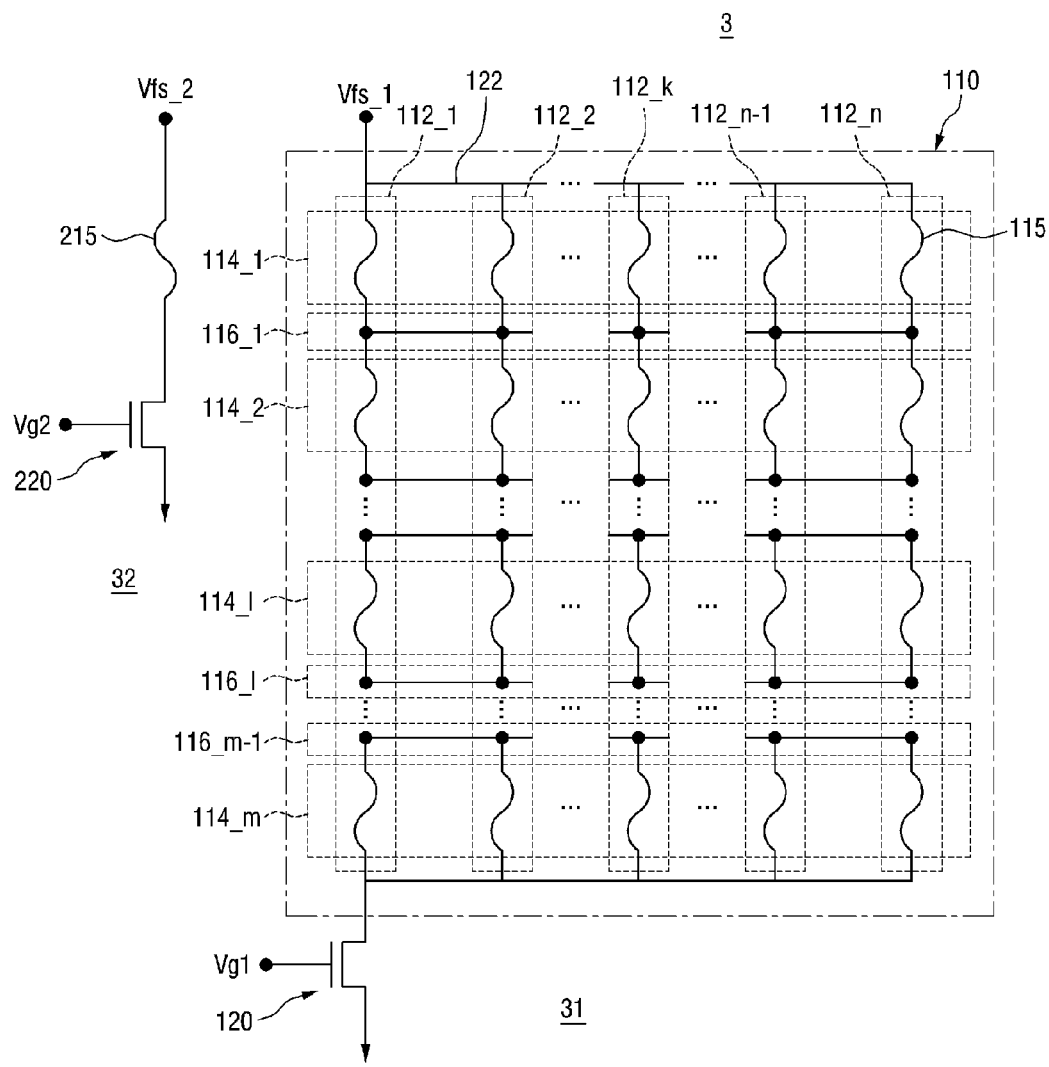
FIG. 4 is a circuit diagram explaining an exemplary e-fuse test device according to a third embodiment of the present disclosure.

FIG. 4 is a circuit diagram explaining an exemplary e-fuse test device according to a third embodiment of the present disclosure. For convenience in explanation, explanation will be made around different points from those as described above using FIG. 2.

Referring to FIG. 4, in an e-fuse test device 3 according to the third embodiment of the present disclosure may include a first circuit 31 and a second circuit 32. The first circuit 31 includes a first transistor 120 and a first fuse array 110, and the second circuit 32 includes a second transistor 220 and a second fuse element 215. In one embodiment, respective first connection terminal groups 116_1 to 116_$m$−1 are connected to each other.

For example, for each of the first connection terminal groups 116_1 to 116_$m$−1, n connection terminals of the corresponding group are connected to each other. Immediate neighboring connection terminals may be directly connected to each other as shown in FIG. 3.

As illustrated in FIG. 4, even if respective n connection terminals that are included in the ($m$−1) first connection terminal groups 116_1 to 116_$m$−1 are connected to each other, the equivalent resistance value of the first fuse array 110 becomes equal to the resistance value of the second fuse element 215.

The e-fuse test device 3 according to the third embodiment of the present disclosure may be explained as follows.

Each of m first row fuse groups 114_1 to 114_$m$ includes n first fuse elements 115. Since the respective first connection terminal groups 116_1 to 116_$m$−1 are connected to each other, n first fuse elements 115 that are included in each of the first row fuse groups 114_1 to 114_$m$ are connected in parallel to each other.

Further, the neighboring first row fuse groups 114_1 to 114_$m$, in which n first fuse elements 115 are connected in parallel to each other, are connected to each other. The first row fuse groups 114_1 to 114_$m$ are connected in series.

Since the m first fuse elements 115 that are included in each of the first column fuse groups 112_1 to 112_$n$ are connected in series to each other, the first fuse elements 115 that are positioned in the k-th one of the first column fuse groups 112_1 to 112_$n$ are connected in series to each other. Here, k is equal to or larger than "1" and equal to or smaller than n.

Hereinafter, the effects of the e-fuse test device according to the embodiments of the present disclosure will be described.

In the case where only one fuse element is used in a test region to program the e-fuse structure that is formed in a device region, once the fuse element that is formed in the test region is disconnected, it is not known what value the current for programming the e-fuse structure has. For example, the device region may include a normal semiconductor device, and the test region may include at least one of e-fuse test devices disclosed herein. The normal semiconductor device of the device region may include integrated circuits formed by semiconductor manufacturing processes, and an e-fuse test device of the test region may include test circuits formed for testing the integrated circuits.

For example, since one fuse element that is formed in the test region is disconnected, current does not flow to the channel region of the transistor that is connected to the fuse element formed in the test region. For such a reason, it is not known what current level is required to program the e-fuse structure formed in the device region.

However, the e-fuse test structure according to the present disclosure uses a fuse array and one fuse element, and thus it becomes possible to measure the level of current for programming the e-fuse structure that is formed in the device region.

Referring to FIG. 4, if the second fuse source $V_{fs\_2}$ is applied to the second fuse element 215 and the second fuse element 215 is disconnected, current is not detected by the detector that is connected to the first source/drain terminal of the second transistor 220. In this case, it is assumed that the current that is used to disconnect the second fuse element 215 is I.

Since the resistance values of the second fuse element 215 and the first fuse array 110 are equal to each other, the voltages that are applied from the first fuse source $V_{fs\_1}$ and the second fuse source $V_{fs\_2}$ become equal to each other, and if the first gate voltage $V_{g1}$ and the second gate voltage $V_{g2}$ are equal to each other, the whole current that flows to the first fuse array 110 between the first end line 122 and the second end line 124 may become equal to I.

Since the respective first row fuse groups 114_1 to 114_m of the first fuse array 110 are connected in series between the first end line 122 and the second end line 124, the current that flows to the first fuse array 110 becomes equal to I.

However, since n first fuse elements 115 in each of the first row fuse groups 114_1 to 114_m are connected in parallel to each other, the current that flows to the first fuse elements 115 becomes I/n. That is, since the current as high as I is applied to the second fuse element 215, the second fuse element 215 is disconnected, whereas since the current as high as I/n is applied to each of the first fuse elements 115 included in the first fuse array 110, each of the first fuse element 115 may not be disconnected.

For example, the current that passes through the first fuse array 110 passes through the channel region of the first transistor 120, and is detected by the detector connected to the first source/drain terminal of the first transistor 120.

For example, using the e-fuse test device according to the embodiments of the present disclosure, it becomes possible to measure the current for programming the e-fuse structure formed in the device region.

Accordingly, based on the programming current measured as described above, it is possible to determine the gate voltage of the e-fuse structure and the fuse source voltage.

Further, if the programming current is set to be too high, the e-fuse structure disconnected may exert an influence on other device structures. For example, since the range of a current region that can program the e-fuse structure formed in the device region can be confirmed through the e-fuse test device according to the present disclosure, the reliability inferiority that may occur according to the fusing form of the e-fuse structure can be suppressed or reduced.

Figure 5:
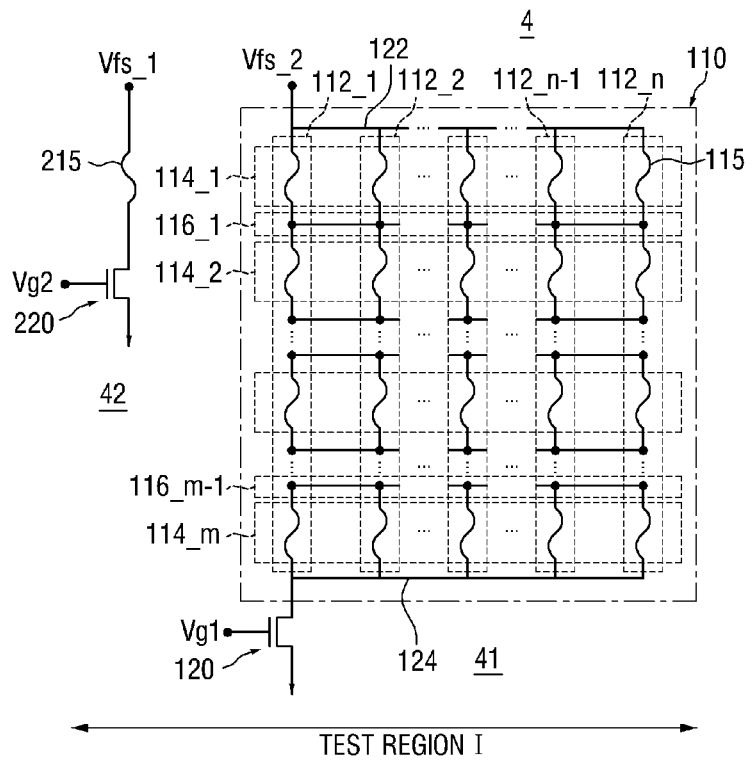
FIG. 5 is a circuit diagram explaining an exemplary e-fuse test device according to a fourth embodiment of the present disclosure.
Figure 5:
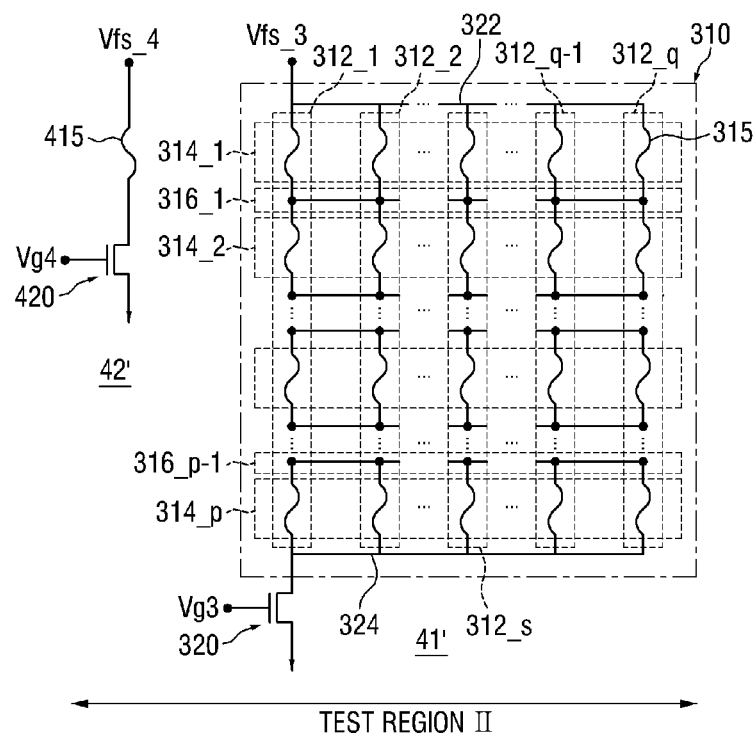

FIG. 5 is a circuit diagram explaining an exemplary e-fuse test device according to a fourth embodiment of the present disclosure. For convenience in explanation, explanation will be made around different points from those as described above using FIG. 4.

Referring to FIG. 5, an e-fuse test device 4 according to the fourth embodiment of the present disclosure may include a first circuit 41 and a second circuit 42 in a first test region TEST REGION I and a third circuit 41' and a fourth circuit 42' in a second test region TEST REGION II. The first circuit 41 of the first test region TEST REGION I includes a first transistor 120 and a first fuse array 110, and the second circuit 42 of the first test region TEST REGION I includes a second transistor 220 and a second fuse element 215. The third circuit 41' of the second test region TEST REGION II includes a third transistor 320 and a second fuse array 310, and the fourth circuit 42' of the second test region TEST REGION II includes a fourth transistor 420 and a fourth fuse element 415.

The first transistor 120, the second transistor 220, the first fuse array 110, and the second fuse element 215 may be arranged in a first test region TEST REGION I, and the third transistor 320, the fourth transistor 420, the second fuse array 310, and the fourth fuse element 415 may be arranged in a second test region TEST REGION II.

The first test region TEST REGION I and the second test region TEST REGION II may be adjacent regions or regions that are spaced apart from each other on the semiconductor substrate.

Explanation of the first transistor 120, the second transistor 220, the first fuse array 110, and the second fuse element 215, which are arranged in the first test region TEST REGION I may be substantially the same as those of the e-fuse test device 3 according to the third embodiment of the present disclosure, but is not limited thereto.

For example, the explanation of the first transistor 120, the second transistor 220, the first fuse array 110, and the second fuse element 215 may be substantially the same as those as described above through the first embodiment or second embodiment of the present disclosure.

The third transistor 320, the fourth transistor 420, the second fuse array 310, and the fourth fuse element 415, which are arranged in the second test region TEST REGION II may have similar structures to the first transistor 120, the second transistor 220, the first fuse array 110, and the second fuse element 215, which are arranged in the first test region TEST REGION I.

More specifically, a third gate voltage $V_{g3}$ may be applied to a gate terminal of the third transistor 320. Further, a first source/drain terminal of the third transistor 320 may be connected to a detector that detects current passing through a channel region of the third transistor 320. A second source/drain terminal of the third transistor 320 is connected to the second fuse array 310.

The second fuse array 310 is arranged between a first end line 322 and a second end line 324. The first end line 322 of the second fuse array 310 may be connected to the third fuse source $V_{fs\_3}$ and the second end line 324 of the second fuse array 310 is connected to the second source/drain terminal of the third transistor 320. The second fuse array 310 is connected in series to the second source/drain terminal of the third transistor 320. Further, the second fuse array 310 is not connected to the gate terminal of the third transistor 320.

The second fuse array 310 may include q second column fuse groups (e.g., q sets of fuses) 312_1 to 312_q. Here, q is a natural number that is equal to or larger than "2".

Each of the second column fuse groups 312_1 to 312_q may include p third fuse elements 315. The p third fuse elements 315 included in each of the second column fuse groups 312_1 to 312_q are connected in series to each other. Here, q is a natural number that is equal to or larger than "2".

Further, each of the second column fuse groups 312_1 to 312_q includes (p−1) connection nodes located between the adjacent third fuse elements 315. That is, since each of the second column fuse groups 312_1 to 312_q includes p third fuse elements 315, each of the second column fuse groups 312_1 to 312_q includes (p−1) connection nodes.

Each of the second column fuse groups 312_1 to 312_q includes one end (e.g., a first end) and the other end (e.g., a second end). Between one end of each of the second column fuse groups 312_1 to 312_q and the other end of each of the second column fuse groups 312_1 to 312_q, p third fuse elements 315 are connected in series to each other.

One end of each of the second column fuse groups 312_1 to 312_q is connected to each other. One end of each of the second column fuse groups 312_1 to 312_q is electrically connected to the third fuse source $V_{fs\_3}$. Further, the other end of each of the second column fuse groups 312_1 to 312_q is connected to each other. The other end of each of the second column fuse groups 312_1 to 312_q is connected to the second source/drain terminal of the third transistor 320.

The second fuse array 310 may include p first row fuse groups 314_1 to 314_p. Each of the second row fuse groups 114_1 to 114_p may include q third fuse elements 315.

Further, the second fuse array 310 includes (p−1) second connection terminal groups 316_1 to 316_p−1. Each of the second connection terminal groups 316_1 to 316_p−1 includes connection terminals that are positioned in the same order from one end of each of the second column fuse groups 312_1 to 312_q. Each of the second connection terminal groups 316_1 to 316_p−1 includes q connection terminals.

The q connection terminals included in each of the second connection terminal groups 316_1 to 316_p−1 may be directly connected to each other. However, for example, the q connection terminals included in the first one of the second connection terminal groups 316_1 to 316_p−1 and the q connection terminals included in the second one of the second connection terminal groups 316_1 to 316_p−1 are not directly connected to each other.

Each of the p second row fuse groups 314_1 to 314_p includes q third fuse elements 315. Since the second connection terminal groups 316_1 to 316_p−1 are connected to each other, the q third fuse elements 315 included in each of the second row fuse groups 314_1 to 314_p are connected in parallel to each other.

Further, the second row fuse groups 314_1 to 314_p, in which q third fuse elements 315 are connected in parallel to each other, are connected to each other. More specifically, the second row fuse groups 314_1 to 314_p are connected in series to each other.

Since the third fuse elements 315 included in each of the second column fuse groups 312_1 to 312_q are connected in series to each other, the third fuse elements 315 positioned in the s-th one of the second column fuse groups 312_1 to 312_q are connected in series to each other. Here, s is equal to or larger than "1" and equal to or smaller than q.

The second fuse array 310 may be an e-fuse structure that includes p×q third fuse elements 315.

A fourth gate voltage $V_{g4}$ may be applied to a gate terminal of the fourth transistor 420. Further, a first source/drain terminal of the fourth transistor 420 may be connected to a detector that detects current passing through the channel region of the fourth transistor 420. A second source/drain terminal of the fourth transistor 420 may be connected to the fourth fuse element 415.

However, if the fourth fuse element 415 is programmed to be disconnected, current may not flow to the channel region of the fourth transistor 420.

The fourth fuse element 415 is arranged between the fourth fuse source $V_{fs\_4}$ and the second source/drain terminal of the fourth transistor 420. The fourth fuse element 415 is connected in series to the second source/drain terminal of the fourth transistor 420. Further, the fourth fuse element 415 is not connected to the gate terminal of the fourth transistor 420.

It is sufficient if the third fuse element 315 and the fourth fuse element 415 are e-fuses, but the shapes of the third fuse element 315 and the fourth fuse element 415 are not limited.

The resistance value of the second fuse array 310 between the first end line 322 and the second end line 324 is the third resistance value, and the resistance value of the fourth fuse element 415 is the fourth resistance value. The third resistance value may be an equivalent resistance value of the p×q third fuse elements 315 that are included in the second fuse array 310.

In the e-fuse test device according to the fourth embodiment of the present disclosure, the third resistance value of the second fuse array 310, the fourth resistance value of the fourth fuse element 415, the first resistance value of the first fuse array 110, and the second resistance value of the second fuse element 215 may be substantially equal to each other.

Further, if p and q are the same natural number, the resistance value of the third fuse element 315 and the resistance value of the fourth fuse element 415 may be equal. If m and n are the same natural number, the resistance value of the first fuse element 115 and the resistance value of the second fuse element 215 may be equal. If m and n are the same natural number, and p and q are the same natural number a resistance value of each of the first fuse element 115, the second fuse element 215, the third fuse element 315, and the fourth fuse element 415 may be equal. For example, a number of each of m and n may be different from a number of each of p and q.

In the e-fuse test device according to the fourth embodiment of the present disclosure, the first gate voltage $V_{g1}$ that is applied to the gate terminal of the first transistor 120, the second gate voltage $V_{g2}$ that is applied to the gate terminal of the second transistor 220, the third gate voltage $V_{g1}$ that is applied to the gate terminal of the third transistor 320, and the fourth gate voltage $V_{g4}$ that is applied to the gate terminal of the fourth transistor 420 may be equal.

Further, in the e-fuse test device according to the fourth embodiment of the present disclosure, the voltage that is applied from the first fuse source $V_{fs\_1}$ to the first fuse array 110, the voltage that is applied from the second fuse source $V_{fs\_2}$ to the second fuse element 215, the voltage that is applied from the third fuse source $V_{fs\_3}$ to the second fuse array 310, and the voltage that is applied from the fourth fuse source $V_{fs\_4}$ to the fourth fuse element 415 may be equal.

Figure 6:
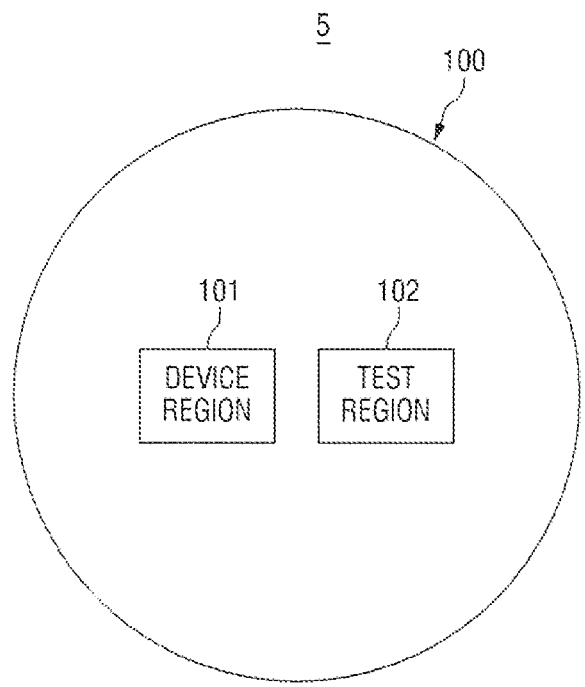
FIGS. 6 and 7 are example diagrams explaining a semiconductor device according to a fifth embodiment of the present disclosure.
Figure 7:
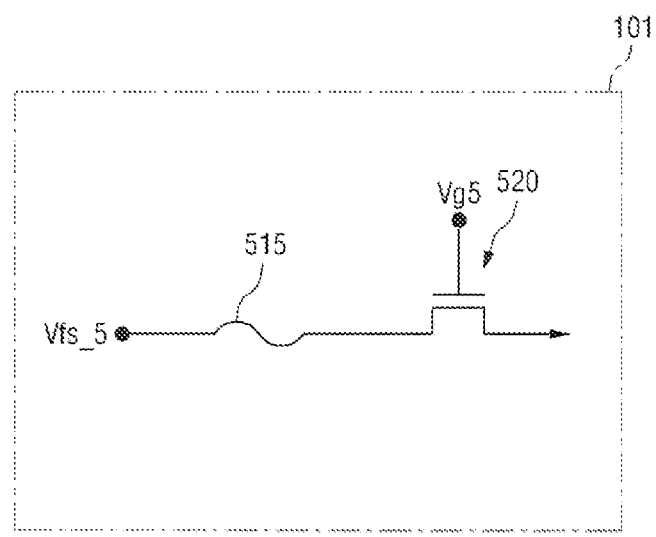

FIGS. 6 and 7 are example diagrams explaining a semiconductor device according to a fifth embodiment of the present disclosure. For reference, FIG. 6 is a schematic diagram explaining a semiconductor device according to the fifth embodiment of the present disclosure, and FIG. 7 is a circuit diagram illustrating an e-fuse structure that is formed in the device region of FIG. 6.

Referring to FIGS. 6 and 7, in a semiconductor device 5 according to the fifth embodiment of the present disclosure, a substrate 100 includes a device region 101 and a test region 102. In one embodiment, the substrate 100 may be a semiconductor wafer, the device region 101 may include a normal semiconductor device, and the test region 102 may include at least one of e-fuse test devices disclosed herein. In another embodiment, the device region 101 and the test region 102 may be disposed in a semiconductor device (or a semiconductor chip). In some embodiments, the normal semiconductor device manufactured as products may be formed on the semiconductor wafer 100 together with the e-fuse test device (and later singulated from the wafer as a semiconductor chip), and the e-fuse test device may be disposed on an edge portion of the semiconductor wafer 100 (separate from the portion of the wafer that is later singulated from the wafer as a semiconductor chip). In other embodiments, the e-fuse device and the normal semiconductor device may be singulated together so that together they form a single semiconductor chip.

In the test region 102, the e-fuse test devices 1 to 4 according to the first to fourth embodiments of the present disclosure as described above using FIGS. 2 to 5 may be formed. Explanation of the test region 102 will be omitted since it is duplicate to the explanation made using FIGS. 2 to 5.

In the device region 101, a fifth transistor 520 and a fifth fuse element 515 may be arranged.

A fifth gate voltage $V_{g5}$ may be applied to a gate terminal of the fifth transistor 520. Further, a first source/drain terminal of the fifth transistor 520 may be connected to a detector that detects current passing through the channel region of the fifth transistor 520. A second source/drain terminal of the fifth transistor 520 is connected to a fifth fuse element 515.

The fifth fuse element 515 is arranged between a fifth fuse source $V_{fs\_5}$ and the second source/drain terminal of the fifth transistor 520. The fifth fuse element 515 is connected in series to the second source/drain terminal of the fifth transistor 520. Further, the fifth fuse element 515 is not connected to the gate terminal of the fifth transistor 520.

In the semiconductor device 5 according to the fifth embodiment of the present disclosure, the resistance value of the fifth fuse element 515 arranged in the device region 101 may be substantially equal to the resistance value of the second fuse element 215 and/or the resistance value of the fourth fuse element 415 arranged in the test region 102.

The fifth gate voltage $V_{g5}$ that is applied to the gate terminal of the fifth transistor 520 may be determined using the e-fuse test devices 1 to 4 arranged in the test region 102.

Further, the voltage that is applied from the fifth gate voltage $V_{g5}$ to the fifth fuse element 515 may be a fuse source voltage that is determined using the e-fuse test devices 1 to 4 arranged in the test region 102.

Figure 8:
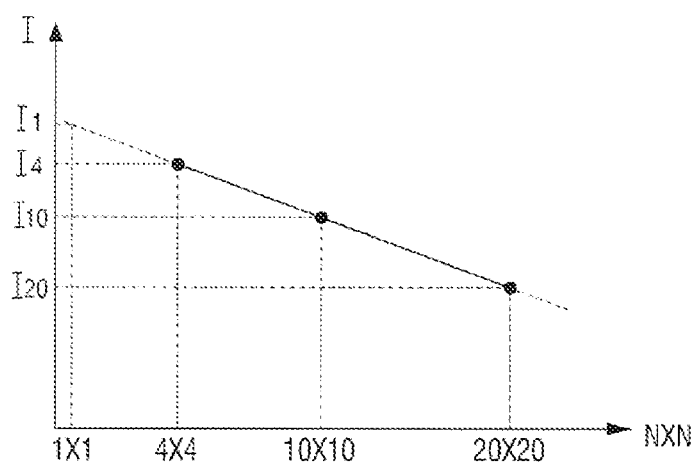
FIG. 8 is a graph explaining an exemplary method for determining e-fuse programming current according to an embodiment of the present disclosure.

Referring to FIG. 8, a method for determining e-fuse programming current according to an embodiment of the present disclosure will be described.

FIG. 8 is a graph explaining an exemplary method for determining e-fuse programming current according to an embodiment of the present disclosure.

For convenience in explanation, it is assumed that three kinds of fuse arrays are used to determine e-fuse programming current. For example, the fuse arrays included in the e-fuse test device may be fuse arrays of 4×4, 10×10, and 20×20.

First, using the fuse arrays of 4×4, 10×10, and 20×20, current values, which pass through the fuse arrays when the fuse elements that correspond to the fuse arrays are disconnected, are measured. In this case, the measured current values may be $I_4$, $I_{10}$, and $I_{20}$. Since a variation of the semiconductor manufacturing each of the measured values $I_4$, $I_{10}$, and $I_{20}$ may have different value as compared with $I_1$.

FIG. 8 illustrates the measured current values as a graph.

Thereafter, test programming current using the e-fuse test device is shown as a graph through analysis of the measured current values using the e-fuse test device.

Then, extrapolation of the test programming current is performed to determine the programming current of the 1×1 fuse array. That is, when only one fuse element is provided, the current value $I_1$ that is required to program one fuse element is determined.

The e-fuse programming current that is determined using the e-fuse test device including the fuse array is used to determine the gate voltage of the transistor and the fuse source voltage, which are required to program the e-fuse structure formed in the device region.

Although example embodiments of the present disclosure have been described for a) illustrative purposes, those skilled in the art will appreciate that various modifications, additions and substitutions are possible, without departing from the scope and spirit of the invention as disclosed in the accompanying claims.

What is claimed is:

1. An e-fuse test device comprising:
a first transistor including a first gate terminal configured to receive a first gate voltage, a first source/drain terminal, and a second source/drain terminal, wherein the e-fuse test device is configured to detect a current passing through the first transistor;
a fuse array including n sets of fuses, each set arranged between a first end line and a second end line;
a second transistor including a gate terminal configured to receive a second gate voltage, a first source/drain terminal, and a second source/drain terminal, wherein the e-fuse test device is configured to detect a current passing through the second transistor; and
a first fuse element including a first end connected to the first source/drain terminal of the second transistor and a second end configured to receive a first source voltage,
wherein each respective set of fuses of the n sets of fuses includes a first end, a second end, and m second fuse elements connected in series to each other between the first end and the second end of each respective set of fuses of the n sets of fuses,
wherein the first ends of the respective sets of fuses of the n sets of fuses are connected to the first end line, and the second ends of the respective sets of fuses of the n sets of fuses are connected to the second end line and the first source/drain terminal of the first transistor,
wherein the first end line is configured to receive a second source voltage, and
wherein the n and m are natural numbers that are equal to or larger than 2.

2. The e-fuse test device of claim 1, wherein each respective set of fuses of the n sets of fuses comprises (m−1) connection terminals that connect the adjacent second fuse elements to each other,
wherein the (m−1) connection terminals of each respective set of fuses of the n sets of fuses includes an l-th connection terminal and the l-th connection terminals of the respective sets of fuses of the n sets of fuses are connected to each other, and
wherein the l is a natural number that is equal to or larger than 1 and equal to or smaller than (m−1).

3. The e-fuse test device of claim 1, wherein each respective set of fuses of the n sets of fuses comprises (m−1) connection terminals each connecting the adjacent second fuse elements to each other, and
wherein each connection terminal of the (m−1) connection terminals is connected to corresponding connection terminals of the respective sets of fuses of the n sets of fuses.

4. The e-fuse test device of claim 1, wherein the n and m are the same number.

5. The e-fuse test device of claim 1, wherein the first fuse element has a first resistance value, and the fuse array has a second resistance value between the first end line and the second end line, and
wherein the first resistance value and the second resistance value are substantially equal.

6. The e-fuse test device of claim 1, wherein the n and m are the same natural number, and wherein a resistance value of each of the m second fuse elements and a resistance value of the first fuse element are equal to each other.

7. The e-fuse test device of claim 1, wherein each voltage level of the first and second source voltages is substantially equal, and
wherein each voltage level of the first and second gate voltages is substantially equal.

8. An e-fuse test device comprising:
a first transistor including a first gate terminal configured to receive a first gate voltage, a first source/drain terminal, and a second source/drain terminal, wherein the e-fuse test device is configured to detect a current passing through the first transistor;
a first fuse array including n sets of fuses, n being a natural number equal to or greater than 2;
a second transistor including a gate terminal configured to receive a second gate voltage, a first source/drain terminal, and a second source/drain terminal, wherein the e-fuse test device is configured to detect a current passing through the second transistor; and
a first fuse element including a first end connected to the first source/drain terminal of the second transistor and a second end configured to receive a first source voltage,
wherein each respective set of fuses of the n sets of fuses includes a first end, a second end, and n second fuse elements connected in series to each other between the first end and the second end of each respective set of fuses of the n sets of fuses,
wherein the respective sets of fuses of the n sets of fuses are connected in parallel to each other,
wherein the respective first ends of the respective sets of fuses are connected to each other and are configured to receive a second source voltage, and
wherein the respective second ends of the respective sets of fuses are connected to the first source/drain terminal of the first transistor.

9. The e-fuse test device of claim 8, wherein an l-th second fuse element of the n second fuse elements is located in the l-th position in each respective set of fuses of the n sets of fuses, wherein l is equal to or greater than 1 and equal to or less than n,
wherein the l-th second fuse element includes a first end and a second end, and
wherein respective first ends of the l-th second fuse elements of the respective sets of fuses of the n sets of fuses are connected to each other or respective second ends of the l-th second fuse elements of the respective sets of fuses of the n sets of fuses are connected to each other.

10. The e-fuse test device of claim 8, wherein a resistance value of each of the n second fuse elements is equal to a resistance value of the first fuse element.

11. The e-fuse test device of claim 8, further comprising:
a third transistor including a gate terminal configured to receive a third gate voltage, a first source/drain terminal, and a second source/drain terminal, wherein the e-fuse test device is configured to detect a current passing through the third transistor; and
a second fuse array including m sets of fuses, m being a natural number equal to or greater than 2 and different from n,
wherein each respective set of fuses of m sets of fuses includes a third end, a fourth end, and m third fuse elements connected in series to each other between the third end and the fourth end,
wherein the respective sets of fuses of m sets of fuses are connected in parallel to each other,
wherein the respective third ends of the respective sets of fuses of the m sets of fuses are connected to each other and are configured to receive a third source voltage, and
wherein the respective fourth ends of the respective sets of fuses of the m sets of fuses are connected to the first source/drain terminal of the third transistor.

12. The e-fuse test device of claim 11, further comprising:
a fourth transistor including a gate terminal configured to receive a fourth gate voltage, a first source/drain terminal, and a second source/drain terminal, wherein the e-fuse test device is configured to detect a current passing through the fourth transistor; and
a fourth fuse element including a first end connected to the first source/drain terminal of the fourth transistor and a second end configured to receive a fourth source voltage.

13. The e-fuse test device of claim 12, wherein a resistance value of each of the m third fuse elements is equal to a resistance value of the fourth fuse element.

14. The e-fuse test device of claim 12, wherein each voltage level of the third and fourth source voltages is substantially equal, and
wherein each voltage level of the third and fourth gate voltages is substantially equal.

15. A semiconductor device comprising:
a first circuit including a first transistor having a gate electrode configured to receive a first gate voltage, a first source/drain electrode and a second source/drain electrode, and a fuse array, the first circuit configured to detect a current passing through the first transistor, wherein the fuse array includes a first end line, a second end line, and first through nth sets of fuses arranged in a row direction between the first and second end lines, wherein each set of the first through nth sets of fuses includes m first fuse elements connected in series to each other and arranged in a column direction between the first and second end lines, wherein the first end line of the fuse array is configured to receive a first source voltage and the second end line of the fuse array is connected to the second source/drain electrode of the first transistor, and wherein m and n are natural numbers equal to or greater than 2; and
a second circuit including a second transistor having a gate electrode configured to receive a second gate voltage, a first source/drain electrode and a second source/drain electrode, and a second fuse element, the second circuit configured to detect a current passing through the second transistor, wherein a first end of the second fuse element is connected to the first source/drain electrode of the second transistor and a second end of the second fuse element is configured to receive a second source voltage.

16. The semiconductor device of claim 15, wherein each voltage level of the first and second source voltages is substantially equal, and
wherein each voltage level of the first and second gate voltages is substantially equal.

17. The semiconductor device of claim 15, wherein a resistance value of each of the m first fuse elements and a resistance value of the second fuse element are substantially equal.

18. The semiconductor device of claim 15, wherein a resistance value between the first and second end lines of the fuse array and a resistance value of the second fuse element are substantially equal.

* * * * *